US 12,253,727 B2

(12) United States Patent
Kuo et al.

(10) Patent No.: US 12,253,727 B2
(45) Date of Patent: Mar. 18, 2025

(54) ELECTRONIC DEVICE

(71) Applicant: Unimicron Technology Corp., Taoyuan (TW)

(72) Inventors: Chun-Hung Kuo, Taoyuan (TW); Tzu-Hsuan Wang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 254 days.

(21) Appl. No.: 17/987,770

(22) Filed: Nov. 15, 2022

(65) Prior Publication Data

US 2023/0314738 A1    Oct. 5, 2023

Related U.S. Application Data

(60) Provisional application No. 63/326,285, filed on Apr. 1, 2022.

(30) Foreign Application Priority Data

Jul. 1, 2022  (TW) .................................. 111124703

(51) Int. Cl.
*G02B 6/42* (2006.01)
*G02B 6/43* (2006.01)
(Continued)

(52) U.S. Cl.
CPC ......... *G02B 6/4214* (2013.01); *G02B 6/4266* (2013.01); *G02B 6/43* (2013.01); *H01L 25/167* (2013.01); *H04B 10/801* (2013.01)

(58) Field of Classification Search
CPC ....... G02B 6/4214; G02B 6/4266; G02B 6/43
See application file for complete search history.

(56) References Cited

U.S. PATENT DOCUMENTS 6,959,125 B2 * 10/2005 Kanda ................. G02B 6/43
385/88
7,406,229 B2 * 7/2008 Bae .................... G02B 6/12004
385/47

(Continued)

FOREIGN PATENT DOCUMENTS

TW   200717828   5/2007
TW   201213360   4/2012
(Continued)

OTHER PUBLICATIONS

"Office Action of Taiwan Counterpart Application", issued on Jun. 20, 2023, p. 1-p. 4.

*Primary Examiner* — Daniel Petkovsek
(74) *Attorney, Agent, or Firm* — JCIPRNET (57) ABSTRACT

An electronic device including a light-emitting element, an IC chip, a substrate, an optical waveguide layer, and an optical signal outlet is provided. The IC chip is configured to control the light-emitting element to emit an optical signal. The light-emitting element is disposed on a first surface of the substrate, and the IC chip is disposed on a second surface of the substrate. The optical waveguide layer is disposed on the first surface of the substrate, and the optical waveguide layer includes a core layer, a cladding layer, and a metal layer. The metal layer is disposed on at least a portion of an interface between the core layer and the cladding layer. The optical signal outlet corresponds to the light-emitting element, and the optical signal reaches the optical signal outlet after being transmitted in the core layer.

11 Claims, 5 Drawing Sheets

(51) Int. Cl.
*H01L 25/16* (2023.01)
*H04B 10/80* (2013.01)

(56) References Cited

U.S. PATENT DOCUMENTS

| | | | | |
|---|---|---|---|---|
| 7,466,880 | B2* | 12/2008 | Windover | H04B 10/801 |
| | | | | 385/129 |
| 8,019,187 | B1* | 9/2011 | Dutta | G02B 6/42 |
| | | | | 385/133 |
| 2005/0185880 | A1 | 8/2005 | Asai | |
| 2006/0228068 | A1 | 10/2006 | Ouchi | |
| 2011/0012221 | A1* | 1/2011 | Fujikata | H01L 31/022408 |
| | | | | 257/458 |
| 2022/0404564 | A1* | 12/2022 | Shimizu | G02B 6/428 |
| 2023/0076560 | A1* | 3/2023 | Shimizu | G02B 6/428 |

FOREIGN PATENT DOCUMENTS

| | | |
|---|---|---|
| TW | 201546508 | 12/2015 |
| TW | 201604606 | 2/2016 |
| TW | 201907190 | 2/2019 |

* cited by examiner

ELECTRONIC DEVICE

CROSS-REFERENCE TO RELATED APPLICATION

This application claims the priority benefits of U.S. provisional application Ser. No. 63/326,285, filed on Apr. 1, 2022, and Taiwan application serial no. 111124703, filed on Jul. 1, 2022. The entirety of each of the above-mentioned patent applications is hereby incorporated by reference herein.

BACKGROUND OF THE INVENTION

Field of the Invention

The invention relates to an electronic device.

Description of Related Art

In response to the high-frequency and high-speed development of 5G, the size of the elements is small and the number of the I/Os is high. With the increase in circuit density, when processing a large number of electronic signals, not only is a large quantity of heat sources generated, but there is also significant signal loss. Therefore, if electronic signals are used for transmission, the issues of device overheating and signal loss are long-standing issues to be overcome.

SUMMARY OF THE INVENTION

The invention provides an electronic device avoiding the issues of overheating and signal loss of the device.

According to an embodiment of the invention, an electronic device is provided, including at least one light-emitting element, at least one IC chip, a substrate, an optical waveguide layer, and at least one optical signal outlet. The at least one IC chip is configured to control the at least one light-emitting element to emit an optical signal. The at least one light-emitting element is disposed on a first surface of the substrate, and the at least one IC chip is disposed on a second surface of the substrate. The optical waveguide layer is disposed on the first surface of the substrate, and the optical waveguide layer includes a core layer, a cladding layer, and a metal layer. The metal layer is disposed on at least a portion of an interface between the core layer and the cladding layer. The at least one optical signal outlet corresponds to the at least one light-emitting element, and the optical signal reaches the at least one optical signal outlet after being transmitted in the core layer.

In an embodiment, a refractive index of the core layer is greater than a refractive index of the cladding layer.

In an embodiment, a portion of the metal layer surrounds the at least one light-emitting element.

In an embodiment, the at least one optical signal outlet is disposed on a side surface of the optical waveguide layer.

In an embodiment, the at least one optical signal outlet is disposed on a front surface of the optical waveguide layer.

In an embodiment, a number of the at least one optical signal outlet is a plurality, one of the plurality of optical signal outlets is disposed on a front surface of the optical waveguide layer, and another one of the plurality of optical signal outlets is disposed on a side surface of the optical waveguide layer.

In an embodiment, the core layer is patterned, a number of the at least one light-emitting element is a plurality, and a number of the at least one optical signal outlet is one.

In an embodiment, the electronic device further includes a redistribution layer disposed between the substrate and the at least one IC chip.

In an embodiment, the substrate has at least one through hole, and the at least one optical signal outlet is located in the through hole.

In an embodiment, the electronic device further includes an optical coupling element and an optical fiber, and the optical coupling element is disposed at the at least one optical signal outlet and connected to the optical fiber, so as to couple the optical signal emitted by the at least one light-emitting element into the optical fiber.

In an embodiment, the electronic device further includes an optical receiver connected to the optical fiber and converting the optical signal into an electrical signal.

In an embodiment, the substrate has at least one groove disposed on the first surface, and the at least one light-emitting element is disposed on a bottom surface of the at least one groove.

In an embodiment, the electronic device further includes a reflective layer disposed on an oblique side surface of the at least one groove and surrounding the at least one light-emitting element.

In an embodiment, the reflective layer and the metal layer are made of a same material.

Based on the above, the electronic device provided by an embodiment of the invention adopts a photoelectric conversion method to convert the electrical signal of the IC chip into the optical signal via the light-emitting element. The optical signal is transmitted in the optical waveguide layer, and then the optical receiver is used to convert the optical signal into the electrical signal. The optical signal may be transmitted in the optical waveguide layer by total reflection, with low loss, and the transmission speed thereof is fast, and a plurality of frequencies may be transmitted at the same time without heat generation, which is more in line with the high-frequency and high-speed requirements of 5G.

In order to make the aforementioned features and advantages of the disclosure more comprehensible, embodiments accompanied with figures are described in detail below.

DESCRIPTION OF THE EMBODIMENTS

Figure 1A:
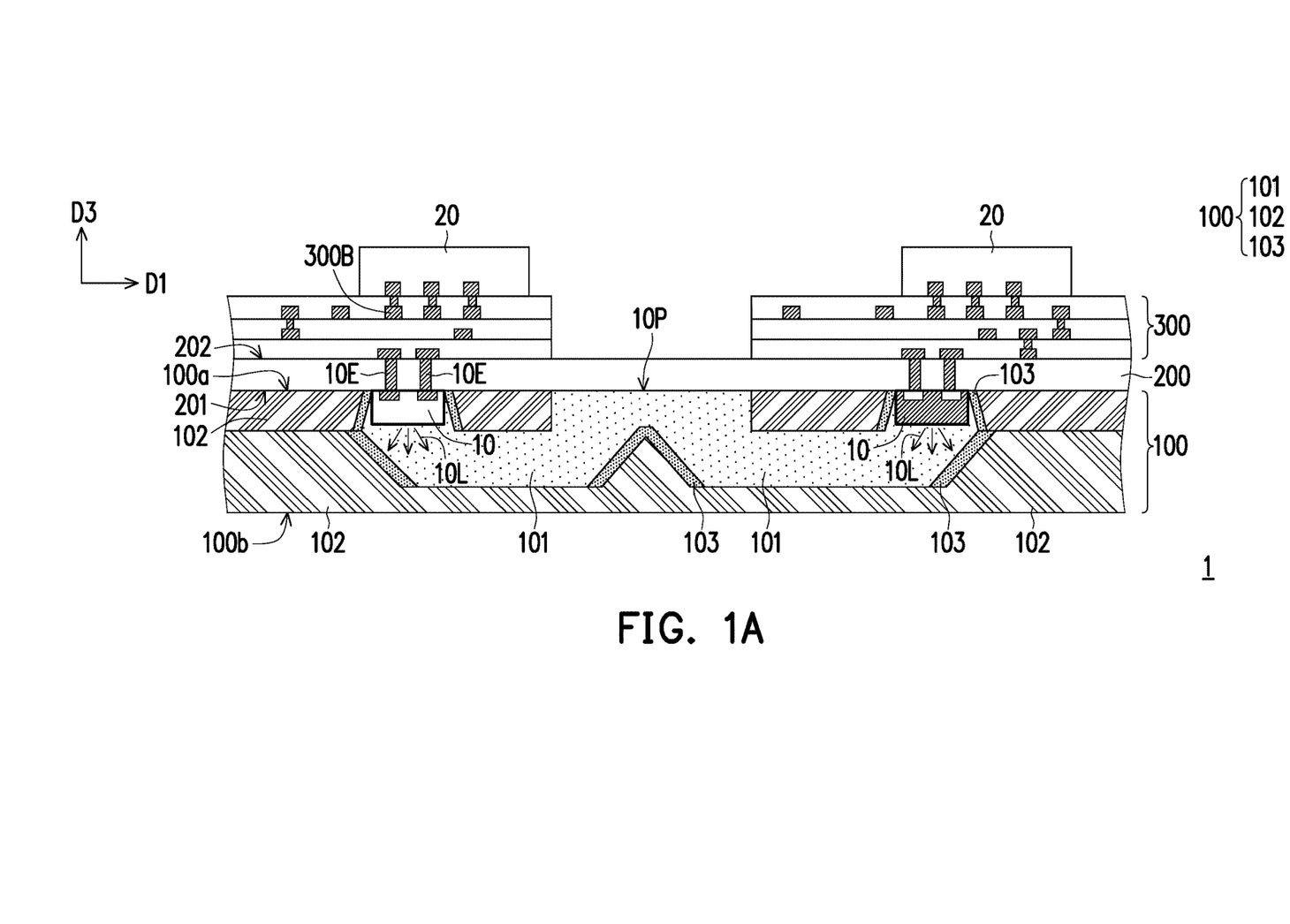
FIG. 1A is a schematic cross-sectional view of an electronic device according to an embodiment of the invention.
Figure 1B:
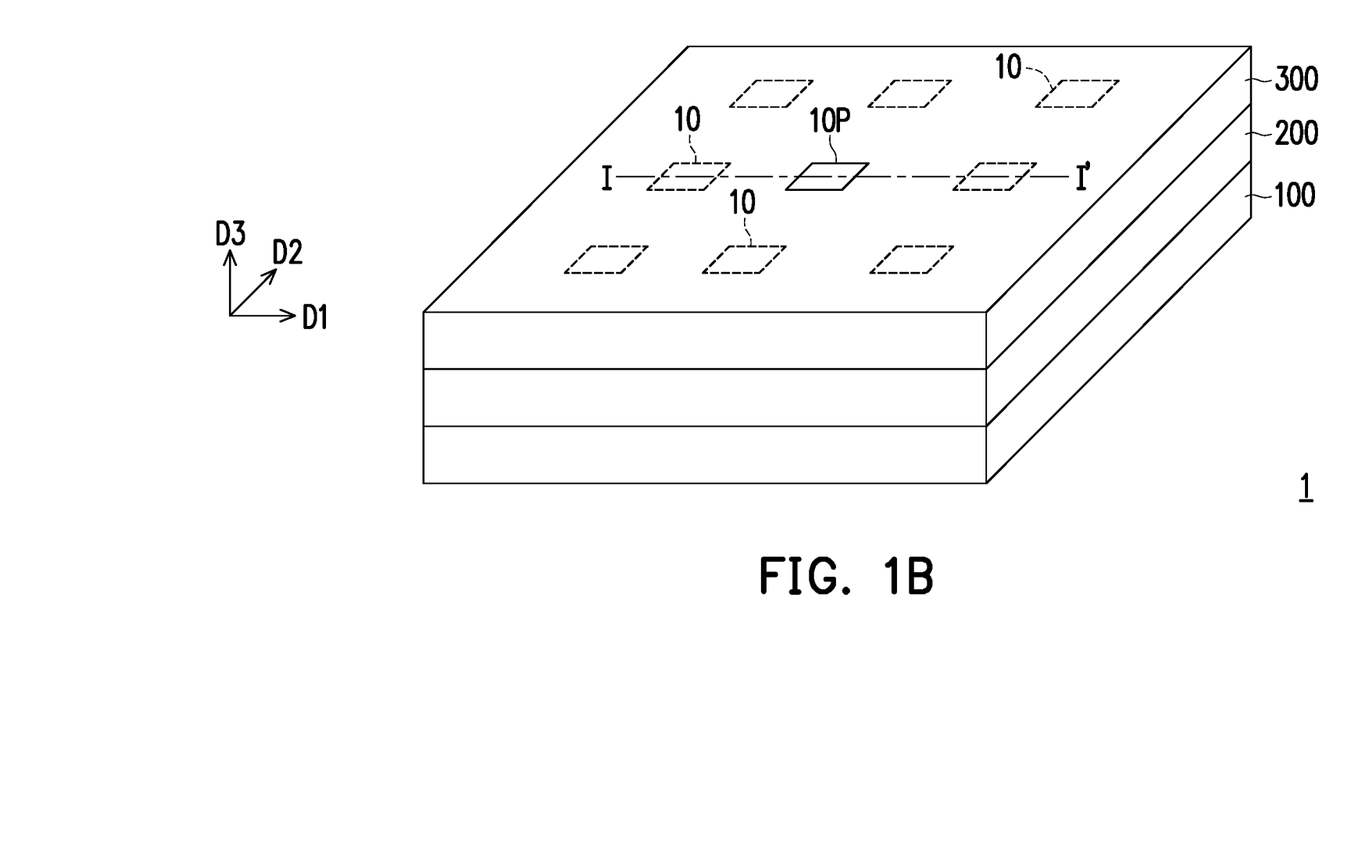
FIG. 1B is a partial structural perspective view of the electronic device shown in FIG. 1A.

Referring to FIG. 1A and FIG. 1B, FIG. 1A is a schematic cross-sectional view of an electronic device according to an embodiment of the invention, and FIG. 1B is a partial structural perspective view of the electronic device shown in FIG. 1A. Specifically, FIG. 1A corresponds to line I-I' of FIG. 1B.

The electronic device 1 includes a light-emitting element 10, an IC chip 20, an optical waveguide layer 100, a substrate 200, and an optical signal outlet 10P. The IC chip 20 is configured to control the light-emitting element 10 to emit an optical signal 10L. The light-emitting element 10 is disposed on a first surface 201 of the substrate 200, and the IC chip 20 is disposed on a second surface 202 of the substrate 200. The optical waveguide layer 100 is disposed on the first surface 201 of the substrate 200, and has two opposite front surfaces 100a and 100b. The optical waveguide layer 100 includes a core layer 101, a cladding layer 102, and a metal layer 103. The optical signal outlet 10P corresponds to the light-emitting element 10. The substrate 200 is not limited to an organic substrate, an inorganic silicon substrate, or others.

In an embodiment, the light-emitting element 10 may be directly connected to the IC chip 20 to emit the optical signal 10L. In the present embodiment, a redistribution layer 300 is disposed between the substrate 200 and the IC chip 20. The redistribution layer 300 is formed via a wafer level metal redistribution process and a conductive bump process. The redistribution layer 300 is configured to change the location of the contacts (e.g., I/O pads) of the IC chip 20 so that the small size IC chip 20 may be further connected to a plurality of other elements or one element. Specifically, the light-emitting element 10 is electrically connected to a conductive pad 300B on the redistribution layer 300 via a conductive pillar 10E penetrating the substrate 200, so as to be further electrically connected to the IC chip 20. The IC chip 20 drives the light-emitting element 10 to emit the optical signal 10L according to the electric signal to be transmitted, so that the optical signal 10L has the information of the electric signal to be transmitted by the IC chip 20. The information carried by the optical signal 10L corresponding to different IC chips 20 is different. The optical signal 10L corresponding to different IC chips 20 may be light of different wavelengths, or may be light of the same wavelength.

The optical signal outlet 10P is located on the front surface 100a of the optical waveguide layer 100 and is covered by the substrate 200. However, the invention is not limited thereto. In other embodiments, the optical signal outlet 10P is not covered by the substrate 200 (not shown).

In the present embodiment, FIG. 1A corresponds to line I-I' of FIG. 1B. That is, FIG. 1A shows a schematic cross-sectional view along a first direction D1 centered on the optical signal outlet 10P of FIG. 1B. It should be mentioned that, FIG. 1A may also be a schematic cross-sectional view with the optical signal outlet 10P of FIG. 1B as the center and along a second direction D2, wherein the second direction D2 is perpendicular to the first direction D1, and a third direction D3 is perpendicular to the first direction D1 and the second direction D2. FIG. 1A may also be a schematic cross-sectional view with the optical signal outlet 10P of FIG. 1B as the center and along a direction having an included angle of 45 degrees with the first direction D1. Moreover, FIG. 1A may also be a schematic cross-sectional view with the optical signal outlet 10P of FIG. 1B as the center and along a direction having an unspecified included angle with the first direction D1. Specifically, the core layer 101 of the electronic device 1 is patterned, and a plurality of light-emitting elements 10 all correspond to the same optical signal outlet 10P. However, the invention is not limited thereto. In other embodiments, one optical signal outlet 10P may only correspond to one light-emitting element 10.

In the present embodiment, the optical signal 10L emitted from the light-emitting element 10 is transmitted in the optical waveguide layer 100, and the refractive index of the core layer 101 is greater than the refractive index of the cladding layer 102, so that the optical signal 10L may be transmitted to the optical signal outlet 10P in the form of total reflection in the core layer 101. The metal layer 103 is disposed on a portion of the interface between the core layer 101 and the cladding layer 102 to ensure that the optical signal 10L is reflected by the metal layer 103 and transmitted to the optical signal outlet 10P. The metal layer 103 is made of a metal with high reflectivity, such as aluminum, silver, or an alloy thereof. However, the invention is not limited thereto. In some embodiments, the refractive index of the core layer 101 may be less than or equal to the refractive index of the cladding layer 102, and the metal layer 103 is disposed on all interfaces between the core layer 101 and the cladding layer 102. In such a case, the optical signal 10L is transmitted to the optical signal outlet 10P by being repeatedly reflected by the metal layer 103.

In the present embodiment, a portion of the metal layer 103 surrounds the light-emitting element 10 and is disposed obliquely with respect to the first surface 201 to ensure that the optical signal 10L emitted by the light-emitting element 10 is transmitted to the core layer 101 and the optical signal outlet 10P, but does not leak light to the redistribution layer 300 and the IC chip 20. Moreover, the substrate 200 is made of a transparent material (e.g., glass or a flexible transparent substrate), so that the optical signal 10L transmitted to the substrate 200 in the core layer 101 may penetrate the substrate 200 and be transmitted to the optical signal outlet 10P.

In order to fully illustrate the various embodiments of the invention, other embodiments of the invention are described below. It should be mentioned here that, the following embodiments adopt the reference numerals of the embodiment above and a portion of the content thereof, wherein the same reference numerals are used to represent the same or similar devices and descriptions of the same technical content are omitted. The omitted portions are as described in the embodiment above and are not repeated in the embodiments below.

Figure 2:
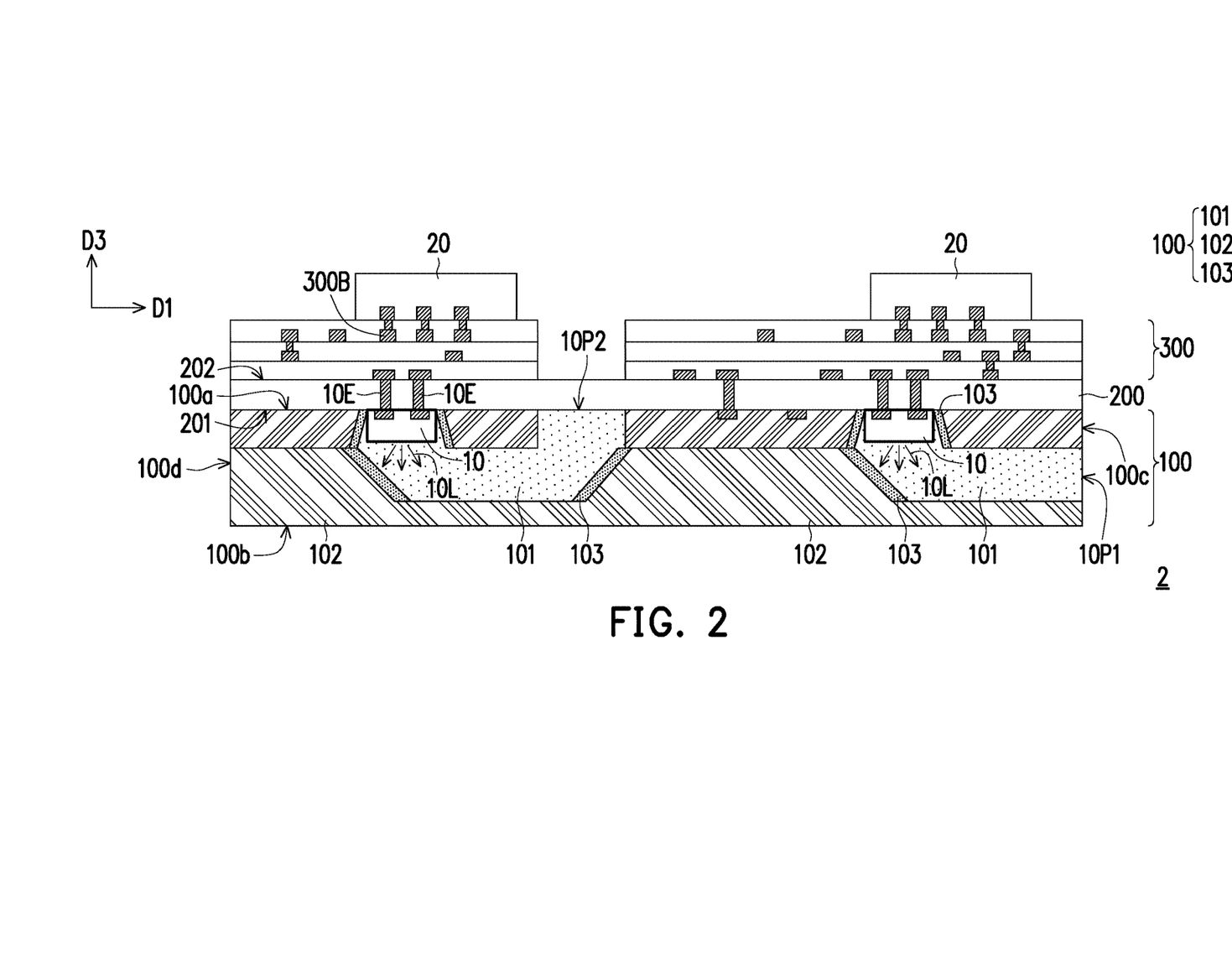
FIG. 2 and FIG. 3 are schematic cross-sectional views of an electronic device according to an embodiment of the invention.

Referring to FIG. 2, a schematic cross-sectional view of an electronic device according to an embodiment of the invention is shown. The difference between an electronic device 2 and the electronic device 1 is that an optical signal outlet 10P1 and an optical signal outlet 10P2 of the electronic device 2 correspond to one light-emitting element 10 respectively. The optical waveguide layer 100 has two opposite front surfaces 100a and 100b and two opposite side surfaces 100c and 100d, and the optical signal outlet 10P1 is located on the side surface 100c of the optical waveguide layer 100, and the optical signal outlet 10P2 is located on the front surface 100a of the optical waveguide layer 100.

Figure 3:
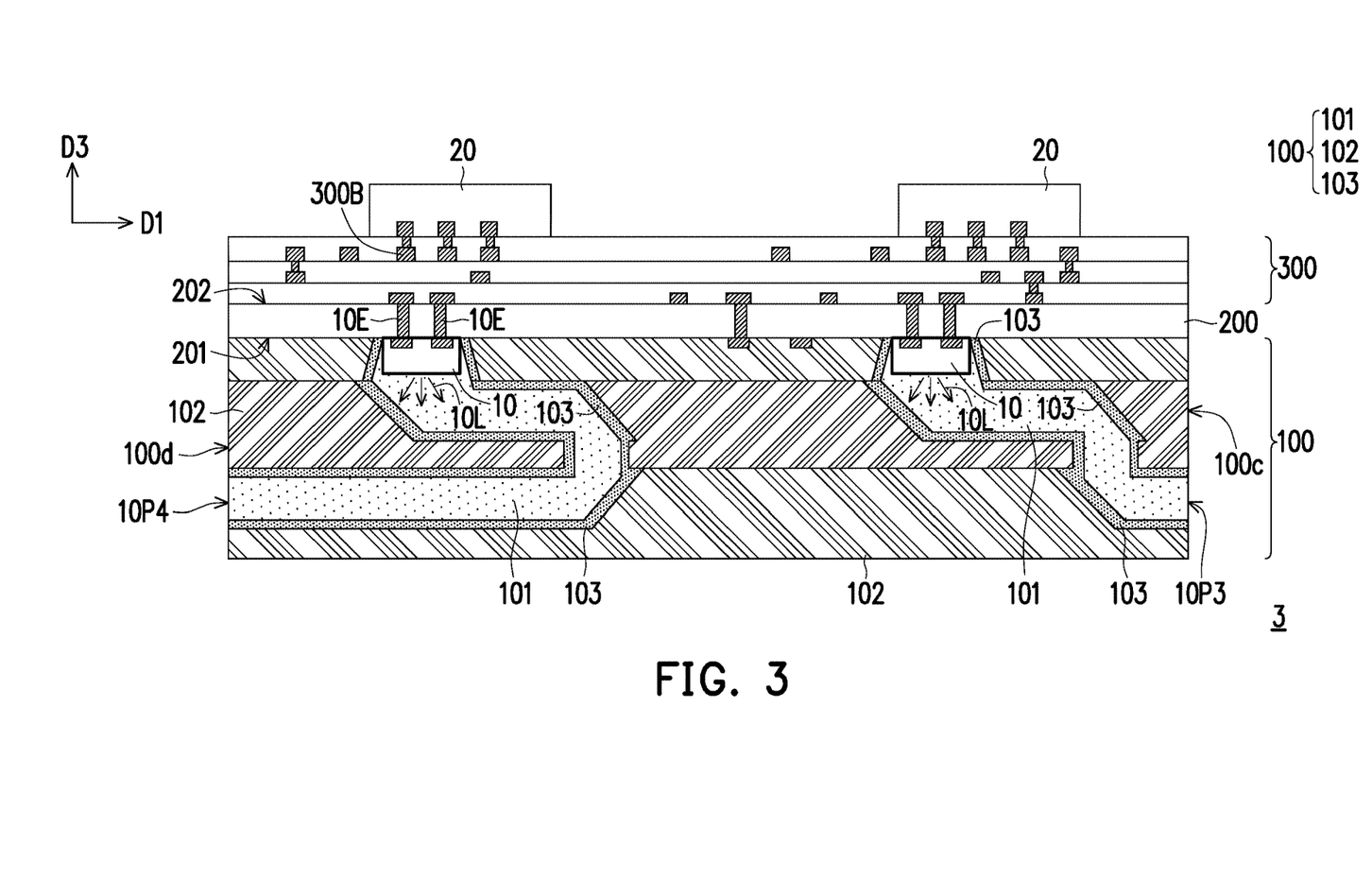

Referring to FIG. 3, a schematic cross-sectional view of an electronic device according to an embodiment of the invention is shown. The difference between an electronic device 3 and the electronic device 1 is that an optical signal outlet 10P3 and an optical signal outlet 10P4 of the electronic device 3 correspond to one light-emitting element 10 respectively, wherein the optical signal outlet 10P3 and the optical signal outlet 10P4 are respectively located on two opposite side surfaces 100c and 100d of the optical waveguide layer 100. In addition, the metal layer 103 is disposed on all the interfaces between the core layer 101 and the cladding layer 102. The optical signal 10L is transmitted to the optical signal outlets 10P3 and 10P4 by being repeatedly reflected by the metal layer 103.

Figure 4:
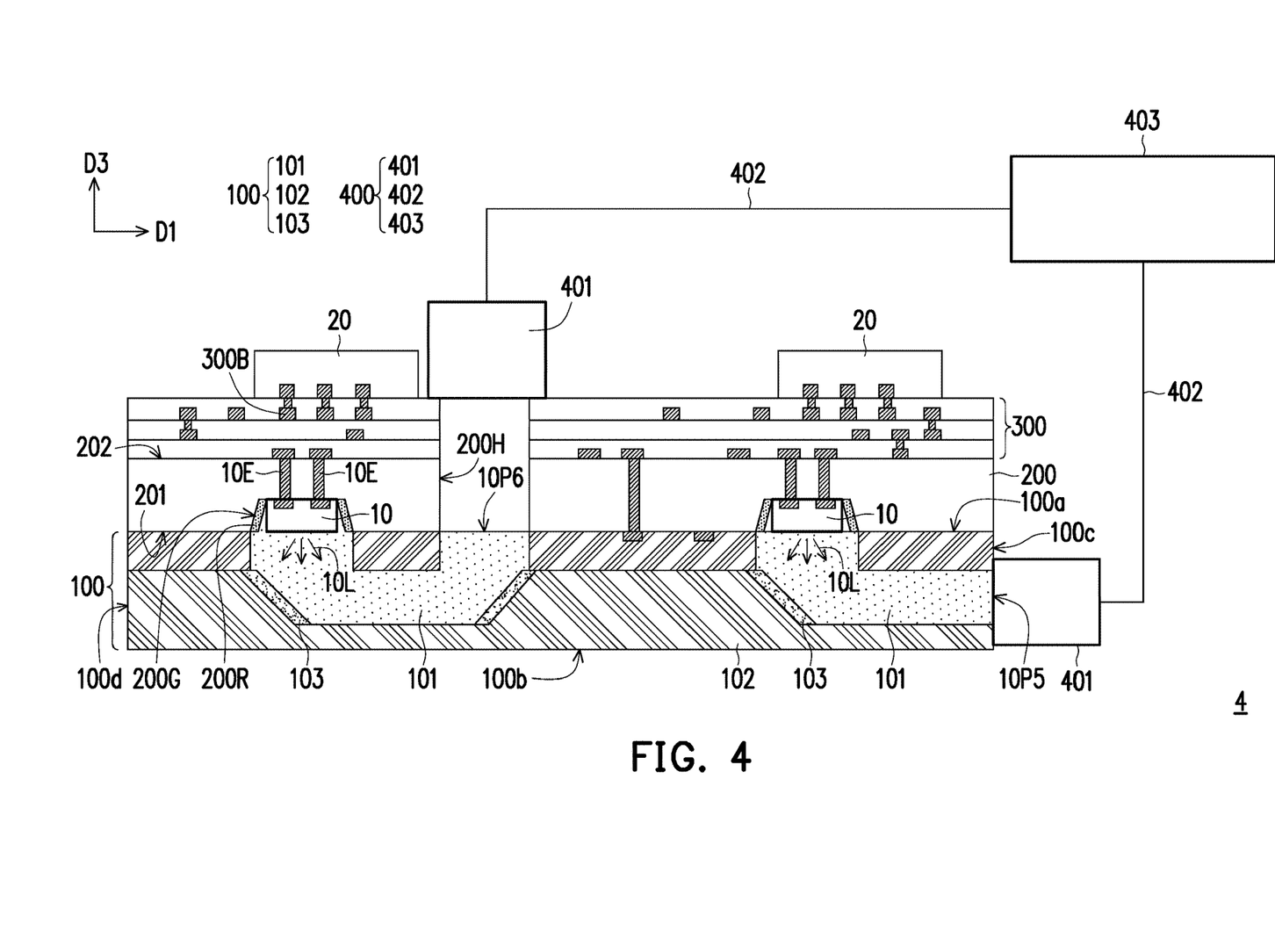
FIG. 4 is a schematic view of an electronic device according to an embodiment of the invention.

Referring to FIG. 4, a schematic diagram of an electronic device according to an embodiment of the invention is shown. Compared to the electronic device 1, an electronic device 4 further includes an optical processing system 400, and the optical processing system 400 includes an optical coupling element 401, an optical fiber 402, and an optical receiver 403. As shown in FIG. 4, an optical signal outlet 10P5 of the electronic device 4 is located on the side surface 100c of the optical waveguide layer 100, an optical signal outlet 10P6 is located on the front surface 100a of the optical waveguide layer 100, and the optical coupling element 401 is correspondingly disposed. The optical coupling element 401 corresponding to the optical signal outlet 10P5 is disposed at the optical signal outlet 10P5. The optical coupling element 401 corresponding to the optical signal outlet 10P6 is disposed on the redistribution layer 300 and faces the optical signal outlet 10P6. Each of the optical coupling elements 401 is connected to the optical fiber 402 to couple the optical signal 10L emitted by the light-emitting element 10 into the optical fiber 402, and further transmit the optical signal 10L to the optical receiver 403 connected to another end of the optical fiber 402. The optical receiver 403 or the back-end processor thereof converts the optical signal 10L into an electrical signal to obtain the electrical signal to be transmitted by the corresponding IC chip 20. In the present embodiment, the optical signal outlet 10P6 is not covered by the substrate 200. However, the invention is not limited thereto. In other embodiments, the optical signal outlet 10P6 may be covered by the substrate 200 (not shown). In other embodiments, the optical signal outlet 10P6 may be covered by the substrate 200 and the redistribution layer 300 (not shown).

It should be noted that, in the present embodiment, each of the light-emitting elements 10 corresponds to a different optical coupling element 401 and optical fiber 402, respectively. However, the invention is not limited thereto, and in other embodiments, different light-emitting elements 10 may also correspond to the same optical coupling element 401 and optical fiber 402. Taking the electronic device 1 shown in FIG. 1A and FIG. 1B as an example, one optical coupling element 401 may be disposed at the optical signal outlet 10P corresponding to a plurality of light-emitting elements 10. This optical coupling element 401 is connected to one optical fiber 402 and one optical receiver 403.

Either a plurality of light-emitting elements 10 correspond to one optical processing system 400 or a plurality of light-emitting elements 10 respectively correspond to a plurality of optical processing systems 400. The optical signal 10L emitted by different light-emitting elements 10 may have the same wavelength or may have different wavelengths. When the optical signal 10L emitted by different light-emitting elements 10 has the same wavelength, the optical signal 10L emitted by different light-emitting elements 10 may be distinguished by modulating each of the optical signals 10L.

Compared with the electronic device 1, the substrate 200 of the electronic device 4 may have a through hole 200H, the through hole 200H corresponds to one light-emitting element 10, and the optical signal outlet 10P6 is located in the through hole 200H. The optical signal 10L transmitted in the core layer 101 may pass through the through hole 200H and be transmitted to the optical signal outlet 10P6.

Although FIG. 4 only schematically shows one through hole 200H, the invention is not limited thereto. In some embodiments, the electronic device 4 may have a plurality of through holes 200H corresponding to a plurality of light-emitting elements 10 respectively. In some embodiments, one through hole 200H may also correspond to a plurality of light-emitting elements 10. Taking the electronic device 1 shown in FIG. 1A as an example, a portion of the substrate 200 between the core layer 101 and the optical signal outlet 10P may be removed, so that the substrate 200 has a through hole (not shown) between the core layer 101 and the optical signal outlet 10P, so that the optical signal 10L from different light-emitting elements 10 and transmitted in the core layer 101 may pass through the through hole (not shown) and be directly transmitted to the optical signal outlet 10P.

The substrate 200 of the electronic device 4 may further have a groove 200G disposed on the first surface 201, and the light-emitting element 10 is disposed on the bottom surface of the groove 200G. In addition, the electronic device 4 further includes a reflective layer 200R. The reflective layer 200R is disposed on the oblique side surface of the groove 200G and surrounds the light-emitting element 10. The reflective layer 200R may be formed of the same material as the metal layer 103 of the optical waveguide layer 100, or may be formed of a different material. The reflective layer 200R surrounding the light-emitting element 10 and disposed obliquely with respect to the first surface 201 may ensure that the optical signal 10L emitted by the light-emitting element 10 is transmitted to the core layer 101 and the optical signal outlets 10P5 and 10P6, and light is not leaked to the substrate 200, the redistribution layer 300, and the IC chip 20.

The light-emitting element 10 in the above embodiments may be implemented by a laser diode or a light-emitting diode, and is directly embedded between the substrate 200 and the optical waveguide layer 100 in the form of a die without encapsulating the die with an encapsulating resin. Since the light-emitting element 10 is embedded between the substrate 200 and the optical waveguide layer 100, it does not occupy the surface of the redistribution layer 300 away from the substrate 200. The surface may be provided with other electronic elements, thus improving the functionality of the electronic devices 1, 2, 3, and 4.

Based on the above, the electronic device provided by an embodiment of the invention adopts a photoelectric conversion method to convert the electrical signal of the IC chip into the optical signal via the light-emitting element. The optical signal is transmitted in the optical waveguide layer, and then the optical receiver is used to convert the optical signal into the electrical signal. The optical signal may be transmitted in the optical waveguide layer by total reflection, with low loss, and the transmission speed thereof is fast, and a plurality of frequencies may be transmitted at the same time without heat generation, which is more in line with the high-frequency and high-speed requirements of 5G.

What is claimed is:

1. An electronic device, comprising:
   at least one light-emitting element;
   at least one IC chip configured to control the at least one light-emitting element to emit an optical signal;
   a substrate, wherein the at least one light-emitting element is disposed on a first surface of the substrate, and the at least one IC chip is disposed on a second surface of the substrate; and
   an optical waveguide layer disposed on the first surface of the substrate, and the optical waveguide layer comprises:
   a core layer;
   a cladding layer; and
   a metal layer disposed on at least a portion of an interface between the core layer and the cladding layer;
   at least one optical signal outlet corresponding to the at least one light-emitting element, and the optical signal reaches the at least one optical signal outlet after being transmitted in the core layer, wherein a portion of the metal layer surrounds sidewalls of the at least one light-emitting element.

2. The electronic device of claim 1, wherein a refractive index of the core layer is greater than a refractive index of the cladding layer.

3. The electronic device of claim 1, wherein the at least one optical signal outlet is disposed on a side surface of the optical waveguide layer.

4. The electronic device of claim 1, wherein the at least one optical signal outlet is disposed on a front surface of the optical waveguide layer.

5. The electronic device of claim 1, wherein a number of the at least one optical signal outlet is a plurality, one of the plurality of optical signal outlets is disposed on a front surface of the optical waveguide layer, and another one of the plurality of optical signal outlets is disposed on a side surface of the optical waveguide layer.

6. The electronic device of claim 1, wherein the core layer is patterned, a number of the at least one light-emitting element is a plurality, and a number of the at least one optical signal outlet is one.

7. The electronic device of claim 1, further comprising a redistribution layer disposed between the substrate and the at least one IC chip.

8. The electronic device of claim 1, wherein the substrate has at least one through hole, and the at least one optical signal outlet is located in the through hole.

9. The electronic device of claim 1, further comprising an optical coupling element and an optical fiber, and the optical coupling element is disposed at the at least one optical signal outlet and connected to the optical fiber, so as to couple the optical signal emitted by the at least one light-emitting element into the optical fiber.

10. The electronic device of claim 9, further comprising an optical receiver connected to the optical fiber and converting the optical signal into an electrical signal.

11. The electronic device of claim 1, wherein the substrate has at least one groove disposed on the first surface, and the at least one light-emitting element is disposed on a bottom surface of the at least one groove.

\* \* \* \* \*